US012224000B2

(12) United States Patent
Bhavnagarwala

(10) Patent No.: US 12,224,000 B2
(45) Date of Patent: Feb. 11, 2025

(54) FAST, ENERGY EFFICIENT 6T SRAM ARRAYS USING HARVESTED DATA

(71) Applicant: Metis Microsystems, LLC, Newtown, CT (US)

(72) Inventor: Azeez Bhavnagarwala, Newtown, CT (US)

(73) Assignee: Metis Microsystems, LLC, Newtown, CT (US)

( * ) Notice: Subject to any disclaimer, the term of this patent is extended or adjusted under 35 U.S.C. 154(b) by 12 days.

(21) Appl. No.: 17/827,763

(22) Filed: May 29, 2022

(65) Prior Publication Data
US 2023/0042652 A1    Feb. 9, 2023

Related U.S. Application Data

(60) Provisional application No. 63/248,491, filed on Sep. 26, 2021, provisional application No. 63/194,053, filed on May 27, 2021.

(51) Int. Cl.
*G11C 7/22*       (2006.01)
*G11C 11/4074*   (2006.01)
(Continued)

(52) U.S. Cl.
CPC ...... *G11C 11/4096* (2013.01); *G11C 11/4074* (2013.01); *G11C 11/4094* (2013.01)

(58) Field of Classification Search
CPC ............ G11C 11/4096; G11C 11/4074; G11C 11/4094
(Continued)

(56) References Cited

U.S. PATENT DOCUMENTS 5,018,106 A * 5/1991 Ul Haq ................. G11C 11/419
                                                      365/233.5
5,982,692 A * 11/1999 Lattimore ............ G11C 7/1048
                                                      365/208
(Continued)

OTHER PUBLICATIONS

Agawa, Ken'ichi, et al., "A bitline leakage compensation scheme for low-voltage SRAMs", IEEE Journal of solid-state Circuits (May 2001); 36(5): 726-734.
(Continued)

*Primary Examiner* — Viet Q Nguyen

(57) ABSTRACT

CMOS harvesting circuits are disclosed for conventional 6T SRAM bitcell arrays enabling substantial improvements to SRAM access time, pipeline performance and to SRAM active and leakage energy consumption—without scaling operating voltages while also improving Read and Write margins using assist schemes at very low area and energy overhead by reusing circuits that harvest charge.

Figure 1:
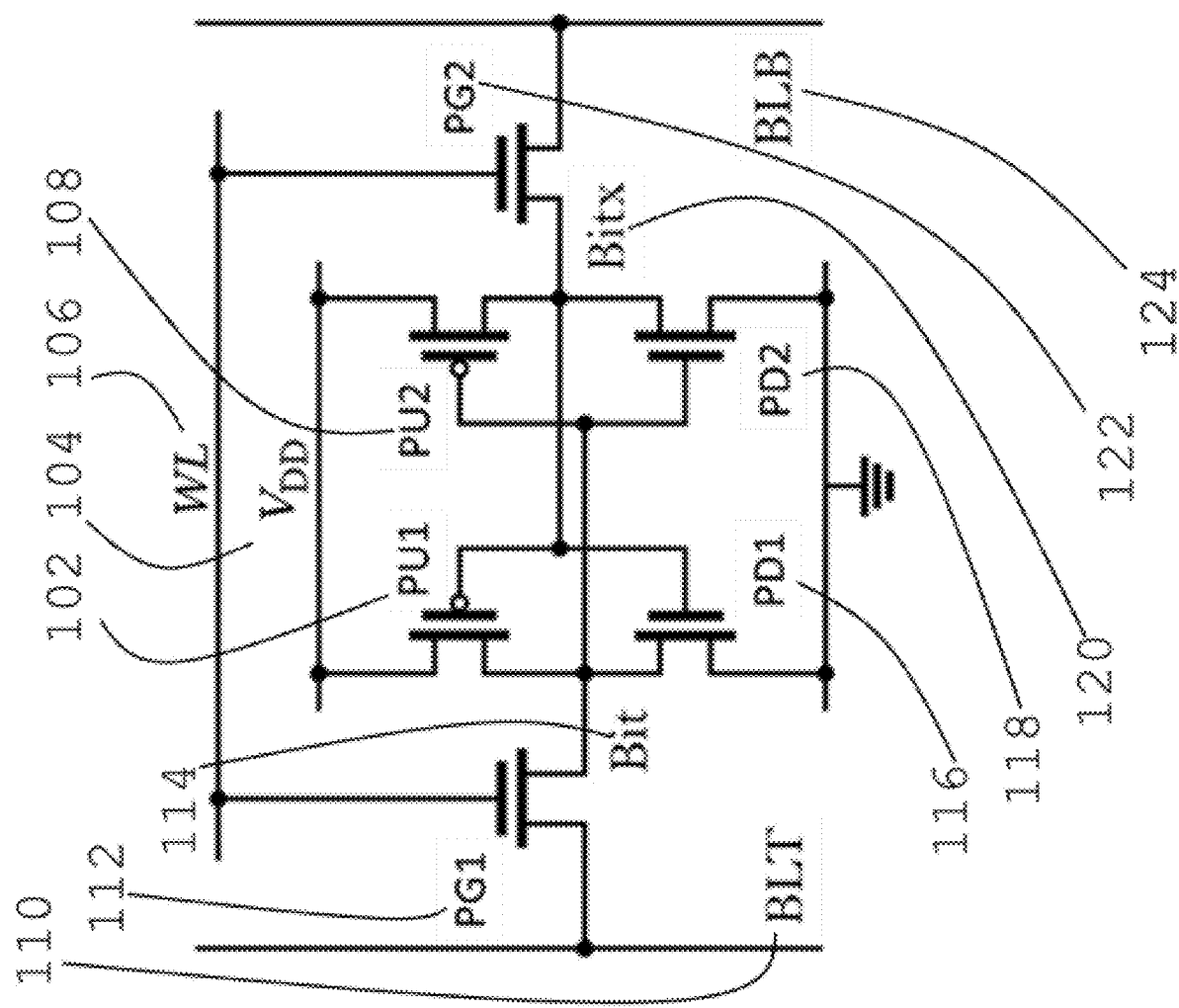
Figure 1:
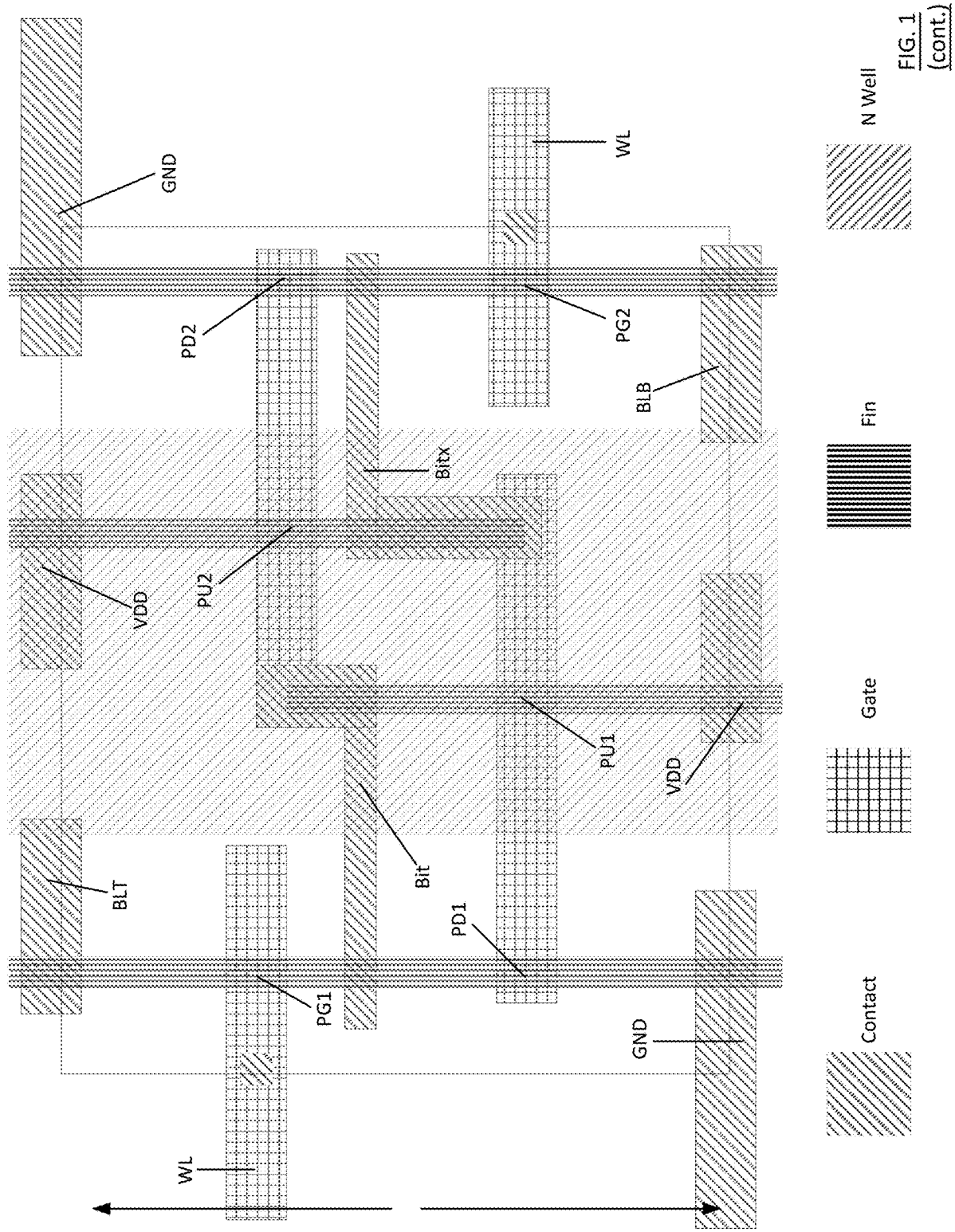

Active energy dissipation during an SRAM read access is lowered by use of novel sensing schemes that self-limit signal development on the BL without the energy overheads seen in conventional designs from sense-amp offsets, BL column leakage and uncertain read current. Improvements in access time are enabled by increasing the signal development rate on the BL—by comparing the rising electric potential of harvested charge with a decreasing BL voltage in a bitcell column using a novel and compact inverting amplifier with dynamic reset. This area and energy efficient scheme leveraging availability of harvested charge not only self-limits signal development on the BL to lower active power and improve read latency, but also eliminates most of the uncertainty of BL voltage signal from uncertain read current by using a capacitive divider. Charge harvested in each column of bitcells from a read/write access is moved to a local harvest grid with a fraction of the capacitance of the (Continued)

BLs accessed in the subarray, at a voltage closer to $V_{DD}$ and is readily tapped into during a following Write access lowering write energy consumption from the power grid by over 30%. Active or standby mode leakage is lowered by the raised voltage of the harvesting node in each column—that is discharged only before the WL selects—for all columns during a Read and for half-select columns during a Write.

16 Claims, 16 Drawing Sheets

(51) Int. Cl.
    *G11C 11/4094*     (2006.01)
    *G11C 11/4096*     (2006.01)

(58) Field of Classification Search
    USPC .................................................. 365/189.011
    See application file for complete search history.

(56) References Cited

U.S. PATENT DOCUMENTS

| | | | | |
|---|---|---|---|---|
| 6,002,626 | A * | 12/1999 | Lattimore | G11C 7/065 365/207 |
| 7,075,840 | B1 * | 7/2006 | Wendell | G11C 11/413 365/189.09 |
| 7,259,986 | B2 * | 8/2007 | Bhavnagarwala | G11C 8/08 365/185.16 |
| 10,777,260 | B1 * | 9/2020 | Chiu | G11C 8/16 |
| 10,878,855 | B1 * | 12/2020 | Lin | G11C 5/14 |
| 2023/0112781 | A1 * | 4/2023 | Bhavnagarwala | H03K 19/0013 327/544 |
| 2023/0120936 | A1 * | 4/2023 | Bhavnagarwala | G11C 11/419 365/154 |
| 2023/0267994 | A1 * | 8/2023 | Bhavnagarwala | H10B 10/12 365/154 |
| 2023/0282272 | A1 * | 9/2023 | Bhavnagarwala | G11C 11/4094 365/189.011 |

OTHER PUBLICATIONS

Arora, Sonu, "AMD Next Generation 7NM Ryzen™ 4000 APU "Renoir"", 2020 IEEE Hot Chips 32 Symposium (HCS) (Aug. 2020); 30 pages.
[Author Unknown] "Predictive Technology Model [PTM] at ASU", Last Updated: Jun. 1, 2012, Retrieved on Oct. 10, 2022 [online]; Retrieved from the Internet: http://ptm.asu.edu/latest.html; 3 pages.
Barry, Brendan, et al., "Always-on Vision Processing Unit for Mobile Applications", IEEE Micro (Mar./Apr. 2015); 35(2): 56-66.
Bhavnagarwala, Azeez, et al, "A 400mV active VMIN, 200mV retention VMIN, 2.8 GHz 64Kb SRAM with a 0.09 um2 6T bitcell in a 16nm FinFET CMOS process", 2016 IEEE Symposium on VLSI Circuits Digest of Technical Papers (VLSI-Circuits) (2016); 2 pages.
Bhavnagarwala, Azeez, et al., "Fluctuation limits & scaling opportunities for CMOS SRAM cells", IEDM Technical Digest (Dec. 2005); 659-662.
Bohr, Mark T., et al., "CMOS Scaling Trends and Beyond", IEEE Micro (Nov./Dec. 2017); 37(6): 20-29.
Chang, Tsung-Yung Jonathan, et al., "A 5-nm 135-Mb SRAM in EUV and High-Mobility Channel FinFET Technology With Metal Coupling and Charge-Sharing Write-Assist Circuitry Schemes for High-Density and Low-VMIN Applications", IEEE Journal of Solid-State Circuits (Jan. 2021); 56(1): 179-187.
Chen, Yen-Huei, et al., "A 16 nm 128 Mb SRAM in High-K Metal-Gate FinFET Technology With Write-Assist Circuitry for Low-VMIN Applications", 2014 IEEE International Solid-State Circuits Conference (ISSCC) (Feb. 11, 2014); pp. 238-240.

Chen, Yen-Huei, et al., "A 16 nm 128 Mb SRAM in High-κ Metal-Gate FinFET Technology With Write-Assist Circuitry for Low-$V_{MIN}$ Applications", IEEE Journal of Solid-State Circuits (Jan. 2015); 50(1): 170-177.
Choquette, Jack, et al., "The A100 Datacenter GPU and Ampere Architecture", 2021 IEEE International Solid-State Circuits Conference (ISSCC) (Feb. 15, 2021); 64: 48-50.
Deng, Jie, et al., "5G and AI Integrated High Performance Mobile SoC Process-Design Co-Development and Production with 7nm EUV FinFET Technology", 2020 IEEE Symposium on VLSI Technology Digest of Technical Papers (Jun. 2020); 2 pages.
Guo, Zheng, et al., "10-nm SRAM Design Using Gate-Modulated Self-Collapse Write-Assist Enabling 175-mV VMIN Reduction With Negligible Active Power Overhead", IEEE Solid-State Circuits Letters (2021); 4: 6-9.
Guo, Zheng, et al, "A 23.6-Mb/$mm^2$ SRAM in 10-nm FinFET Technology With Pulsed-pMOS TVC and Stepped-WL for Low-Voltage Applications", IEEE Journal of Solid-State Circuits (Jan. 2019); 54(1): 210-216.
Jia, Zhe, et al., "Dissecting the Graphcore IPU Architecture via Microbenchmarking", Technical Report (Dec. 7, 2019); 91 pages.
Kang, Mingu, et al, "Deep In-memory Architectures for Machine Learning", Springer Nature Switzerland AG (2020); 6 pages.
Karl, Eric, et al., "A 0.6 V, 1.5 GHZ 84 Mb SRAM in 14 nm FinFET CMOS Technology With Capacitive Charge-Sharing Write Assist Circuitry", IEEE Journal of Solid-State Circuits (Jan. 2016); 51(1): 222-229.
Karl, Eric, et al., "A 4.6GHz 162Mb SRAM design in 22nm tri-gate CMOS technology with integrated active $V_{MIN}$-enhancing assist circuitry", 2012 IEEE International Solid-State Circuits Conference (ISSCC) (Feb. 21, 2012); pp. 230-232.
Kawasumi, Atsushi, et al., "Energy efficiency deterioration by variability in SRAM and circuit techniques for energy saving without voltage reduction", 2012 IEEE International Conference on IC Design & Technology (2012); 4 pages.
Koduri, Raja, "No Transistor Left Behind", Intel Keynote Hot Chips 32, (Aug. 2020); 82 pages.
Lie, Sean, "Wafer scale deep learning", HotChips31 (Aug. 2019); 31 pages.
Meindl, J. D., et al., "The impact of stochastic dopant and interconnect distributions on gigascale integration", 1997 IEEE International Solids-State Circuits Conference {ISSCC) (Feb. 1997); pp. 232-233 and 463.
Norrie, Thomas, et al., "The Design Process for Google's Training Chips: TPUv2 and TPUv3", IEEE Micro (Mar./Apr. 2021); 41(2): 56-63.
Papazian, I. E., "Next 3rd Gen Intel® Xeon® Scalable Server Processor: Icelake-SP", 2020 IEEE Hot Chips 32 Symposium (HCS) (Aug. 2020); 21 pages.
Schmidt, Colin, et al., "An Eight-Core 1.44GHz RISC-V Vector Machine in 16nm FinFET", 2021 IEEE International Solid-State Circuits Conference (ISSCC) (Feb. 16, 2021); 64: 58-60.
Sinangil, Mahmut E., et al., "A 28 nm 2 Mbit 6 T SRAM With Highly Configurable Low-Voltage Write-Ability Assist Implementation and Capacitor-Based Sense-Amplifier Input Offset Compensation", IEEE Journal of Solid-State Circuits (Feb. 2016); 51(2): 557-567.
Sinangil, Mahmut E., et al., "Application-Specific SRAM Design Using Output Prediction to Reduce Bit-Line Switching Activity and Statistically Gated Sense Amplifiers for Up to 1.9× Lower Energy/ Access", IEEE Journal of Solid-State Circuits (Jan. 2014); 49(1): 107-117.
Tachibana, Fumihiko, et al., "A 27% Active and 85% Standby Power Reduction in Dual-Power-Supply SRAM Using BL Power Calculator and Digitally Controllable Retention Circuit", IEEE Journal of Solid-State Circuits (Jan. 2014); 49(1): 118-126.
Wang, Yih, et al., "A 4.0 GHZ 291 Mb Voltage-Scalable SRAM Design in a 32 nm High-k + Metal-Gate CMOS Technology With Integrated Power Management", IEEE Journal of Solid-State Circuits (Jan. 2010); 45(1): 103-110.
Wicht, Bernhard, et al., "Yield and speed optimization of a latch-type voltage sense amplifier", IEEE Journal of Solid-State Circuits (Jul. 2004); 39(7): 1148-1158.

(56) References Cited

OTHER PUBLICATIONS

Wu, Shien-Yang, et al., "An enhanced 16nm CMOS technology featuring $2^{nd}$ generation FinFET transistors and advanced Cu/low-k interconnect for low power and high performance applications", 2014 IEEE International Electron Devices Meeting (2014); pp. 3.1.1-3.1.4.

Yeap, Geoffrey, et al., "5nm CMOS Production Technology Platform featuring full-fledged EUV, and High Mobility Channel FinFETs with densest $0.021\mu m^2$ SRAM cells for Mobile SoC and High Performance Computing Applications", 2019 IEEE International Electron Devices Meeting (IEDM) (2019); pp. 36.7.1-36.7.4.

Zhang, Kevin, "Circuit Design in Nano-Scale CMOS Technologies", 2018 IEEE Asian Solid-State Circuits Conference (A-SSCC) (Nov. 5-7, 2018); 4 pages.

Non-Final Office Action for U.S. Appl. No. 17/953,091 dated Dec. 28, 2023, 7 pages.

\* cited by examiner

400

500

800

Variance of Logic Threshold vs Differential Sense Amp:

$$K_n(V_{LT} - V_{TN})^\alpha = K_p(V_{DD} - V_{LT} - V_{TP})^\alpha \quad (1)$$

$$\frac{V_{DD} - V_{LT} - V_{TP}}{V_{LT} - V_{TN}} = \left(\frac{K_n}{K_p}\right)^{\frac{1}{\alpha}} = \tau \text{ comparable to unity for balanced inverter}$$

$$V_{LT} = \frac{V_{DD}}{1+\tau} + \frac{\tau V_{TN} - V_{TP}}{1+\tau} \quad (2)$$

$$f(V_{LT}) = f(V_{LT}^{Tn}) * f(V_{LT}^{Tp})$$

[joint distribution of a function of 2 random variables]

- with $f(V_{LT}^{Tn}) = \frac{f(V_{Tn})}{\frac{\partial V_{LT}}{\partial V_{TN}}} \sim 2f(V_{Tn}) \quad (3)$

- and $f(V_{LT}^{Tp}) = \frac{f(V_{Tp})}{\frac{\partial V_{LT}}{\partial V_{TP}}} \sim 2f(V_{Tp}) \quad (4)$ $$\sigma V_{LT} = \sqrt{\frac{1}{4}\sigma_{Vtp}^2 + \frac{1}{4}\sigma_{Vtn}^2} \cong \frac{\sigma V_T}{\sqrt{2}}, \text{ assuming } \sigma_{VTp} \cong \sigma_{VTp} \quad (5)$$

Gate input offset in Differential Voltage Sense amp:

$$\sigma V_{OS} = \sigma(V_{TL} - V_{TR}) = \sqrt{2} \times \sigma V_T$$

So, $\sigma V_{LT} = \sigma V_{OS}/2$ (6)

Figure 7:
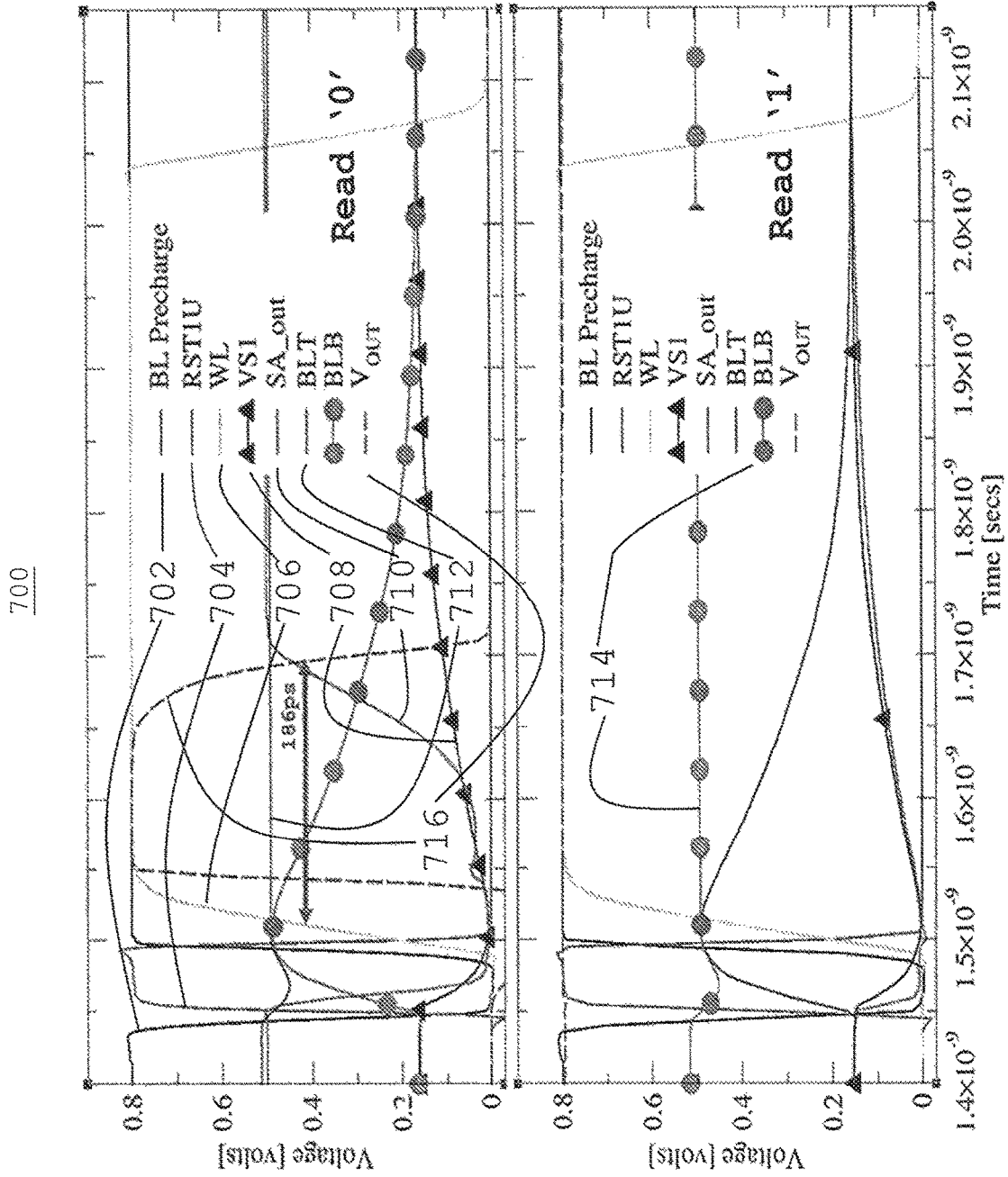

For the sensing scheme proposed in Fig 7 the Voltage across the inverter ~ ½ $V_{DD}$ Given $\sigma V_T$'s linear dependence on DIBL, drain voltage [30], (7)

$\sigma V_{LT} \sim [1/3\, \sigma V_{os} - 1/2\, \sigma V_{os}]$

FIG. 9

$$K_n(V_{LT} - V_{TN})^\alpha = K_p(V_{DD} - V_{LT} - V_{TP})^\alpha$$

$$\frac{V_{DD} - V_{LT} - V_{TP}}{V_{LT} - V_{TN}} = \left(\frac{K_n}{K_p}\right)^{\frac{1}{\alpha}} = \tau \text{ comparable to unity for balanced inverter}$$

$$V_{LT} = \frac{V_{DD}}{1+\tau} + \frac{\tau V_{TN} - V_{TP}}{1+\tau}$$

$$f(V_{LT}) = f(V_{LT}^{Tn}) * f(V_{LT}^{Tp})$$

[joint distribution of a function of 2 random variables]

- with $f(V_{LT}^{Tn}) = \frac{f(V_{Tn})}{\frac{\partial V_{LT}}{\partial V_{TN}}} \sim 2f(V_{Tn})$

- and $f(V_{LT}^{Tp}) = \frac{f(V_{Tp})}{\frac{\partial V_{LT}}{\partial V_{TP}}} \sim 2f(V_{Tp})$ $$\sigma V_{LT} = \sqrt{\frac{1}{4}\sigma^2_{Vtp} + \frac{1}{4}\sigma^2_{Vtn}} \cong \frac{\sigma V_T}{\sqrt{2}}, \text{ assuming } \sigma_{VTp} \cong \sigma_{VTp}$$

FIG. 9
(Cont.)

1000

1200

FAST, ENERGY EFFICIENT 6T SRAM ARRAYS USING HARVESTED DATA

1. INTRODUCTION

CMOS 6T SRAM bitcells have served as the primary workhorse for embedded memories across a broad range of applications—HPC in datacenter server CPUs & GPUs [1-4], Domain Specific Accelerators for AI workloads [5-8], power constrained application processors in mobile devices [9] and in ultra-low cost and pervasive edge/end-point IoT devices or wireless devices supporting AI workloads [10]. Primary reasons for this dominant presence across as wide a range of applications are (1) Fast access and cycle time (2) compatibility across CMOS logic platform technologies— not requiring additional process steps or masks as eDRAM, MRM, embedded Flash technologies do and (3) lowest operating voltages across all memory technology candidates making it the most energy efficient choice for a given operating voltage.

While it's compatibility with CMOS logic platform technologies have enabled SRAM bitcells to scale their footprint 50% every technology node [11, 12], scaling of SRAM operating voltages and improvements in SRAM energy efficiency has been harder. The quantization of device width in FinFET SRAM bitcells (FIG. 1) in tandem with the uncertainty of electrical characteristics of small geometry bitcell transistors require Assist circuit schemes for dense bitcells to improve yield at nominal and low voltages. The competing requirements for Read Vs Write margins, leakage Vs performance, density Vs VMIN etc., in the presence of bitcell variability create challenges in array design for practically all of the different application needs—making the above trade-offs even more challenging at low voltages [13,14,15]. Assist techniques such as WL under-drive (WLUD) to improve Read stability margins and/or negative BLs to improve Write margins come with a combination of performance, energy efficiency, area efficiency and reliability penalties [16-17] where the energy overhead of using Assist techniques can be as much as 26%-31% [18-19] with an area overhead (assuming 256b/BL) of 5%-11% [18] to support the Write assist techniques alone. Performance overheads of Read Assist techniques such as WLUD can be high when used in large (>100 Mb) arrays with long BLs and differential sensing schemes.

In this disclosure—simple, compact and robust harvesting circuits and methods are described following a review of conventional SRAM circuits. Proposed circuits are also shown to lower the impact of MOS device electrical uncertainties on Read/Write Energy efficiency and performance.

2. PRIOR ART

Figure 2:
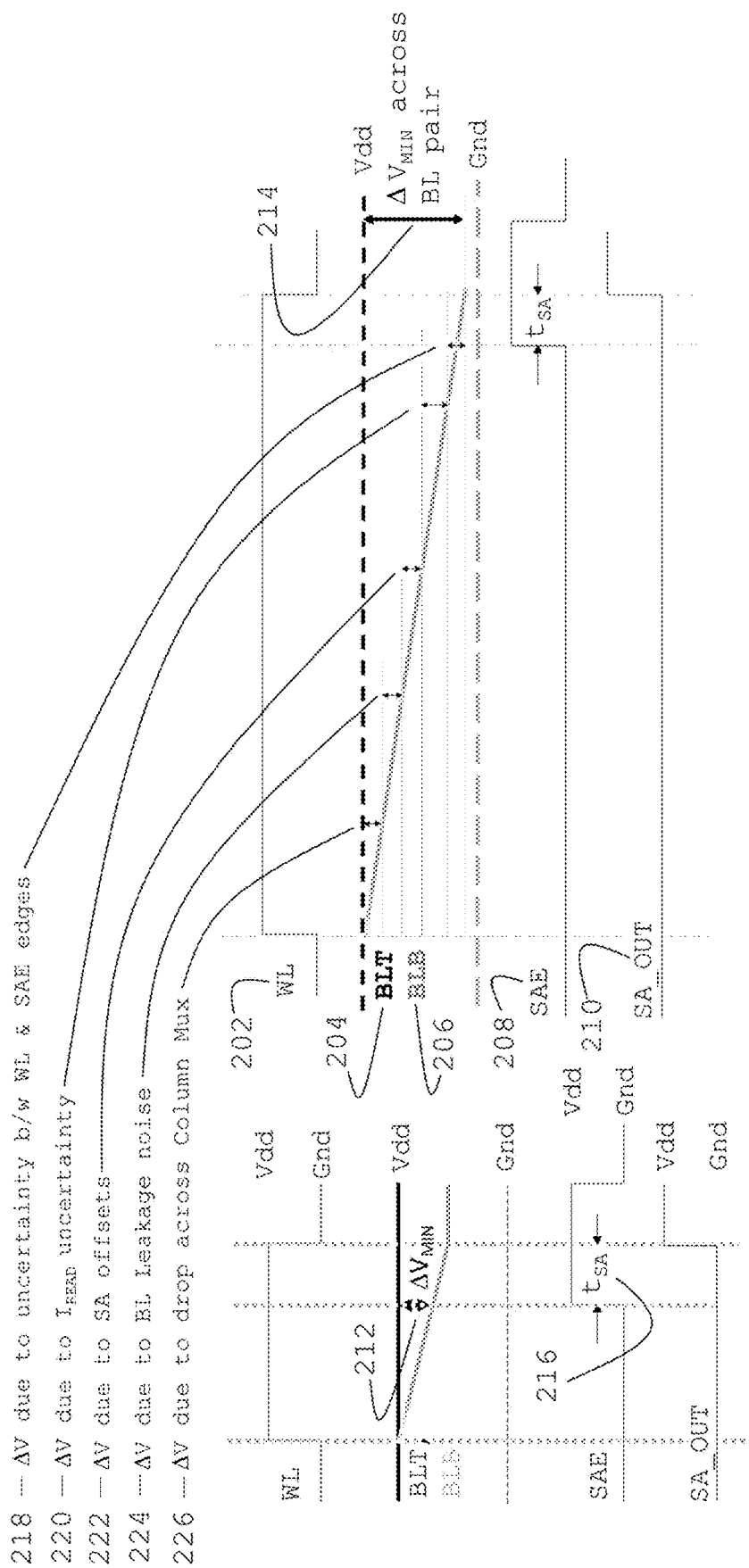

A. Differential Sense Amplifiers (DSA):

Latch-type sense amplifiers [21] typically used in SRAM arrays, achieve fast action due to strong positive feedback and can resolve small changes in BL voltage signals with $\Delta V min$ of merely 50-100 mV making them energy efficient as well. However, the WL pulse width—the time required to build sufficient signal across a BL pair, must be wide enough for the slowest bitcell in the array whose margining is illustrated in FIG. 2 (200). Sense-amp offsets (222), leakage noise from unselected bitcells (224), signal loss across column mux transistors (226), uncertainty in delay difference b/w WL select and Sense Amp enable edges (218) and read current uncertainty (220)—all increase the minimum BL voltage swing (212 Vs 214) required for the slowest bitcell, which increases the BL voltage signal developed by all of the other (faster) bitcells. Wider WL pulse widths thus required for the slowest bitcell to develop its (larger) required BL voltage signal in tandem with increased read current variability (in larger arrays) give all bitcells faster than the slowest one, more time to discharge the precharged BL increasing their BL signal swing closer to VDD [16,17, 22]. The WL pulse width equals the minimum cycle time when large arrays support a pipelined access [23] at the same clock rate as the processor core. Longer WL pulse-widths to support the above uncertainties directly translate into pipeline performance degradation in larger arrays because the left end of the read current distribution corresponds to an even smaller current requiring even wider WL pulse widths—setting limits on maximum SRAM pipeline clock frequency.

B. Read Assist:

Read and Write Assist circuits have become essential to enabling SRAM voltage scaling given the statistical variations in single fin bitcell devices and the accompanying degradation of bitcell noise margins. While improvements in minimum operating voltage have been reported with commonly used Read and Write Assist circuit schemes that favorably bias the bitcell terminals to improve noise margins for Read or Write, these techniques add energy and area overheads that diminish the benefits of operating at lower voltages.

For example, the commonly used Read assist of WL underdrive (WLUD)[24] limits the maximum WL voltage to below VDD to improve cell stability from a higher cell beta ratio given by PD1,2(116,118)/PG1,2(112,122) (corresponding transistors identified in FIG. 1). The gate overdrive of an average cell pass transistor (112,122) sees a marginal reduction in read current, but the reduction of read current from under-driving the WL in the slowest bitcell (that sets the minimum on WL pulse width) is much larger [16] since the gate overdrive in that cell~(VDD−VTmax) is small to begin with, given VTmax from VT fluctuations in large arrays [24]. Moreover, the Write margin is reduced since WL is also underdriven during a Write [25] to support the stability needs of half-selected bitcells during a Write.

C. Write Assist:

Bitcells with large random VT fluctuations can fail a Write attempt if the bitcell Pull-Up (PU) PFETs (102, 108) holding a '1' at the storage node are much stronger than the Pass-Gate (PG) NFETs (112,122) through which a '0' on the BL is attempting a Write. Write margins can be improved by weakening the PU PFET and/or strengthening the PG NFET. Lowering or collapsing the supply terminal of columns selected for a Write [24,25,26,27] thus improves the Write Margin of the selected cell by weakening the PU PFET but comes at a substantial energy overhead since the total capacitance the cell supply terminal sees includes not just the diffusion capacitance of the pull-up PMOS bitcell transistors connected to the cell supply terminal but also the total diffusion capacitance (326) of the storage node the supply terminal is connected to through an 'on' PMOS (FIG. 3) and the gate input capacitance (of PU1 and PD1 in FIG. 3) that storage node 'Bitx' drives. In total, this capacitance is about 4× the device capacitance seen by the BL terminal (324) of the cell making the energy overhead to recover the voltage at the supply terminal substantial [27].

Figure 4:
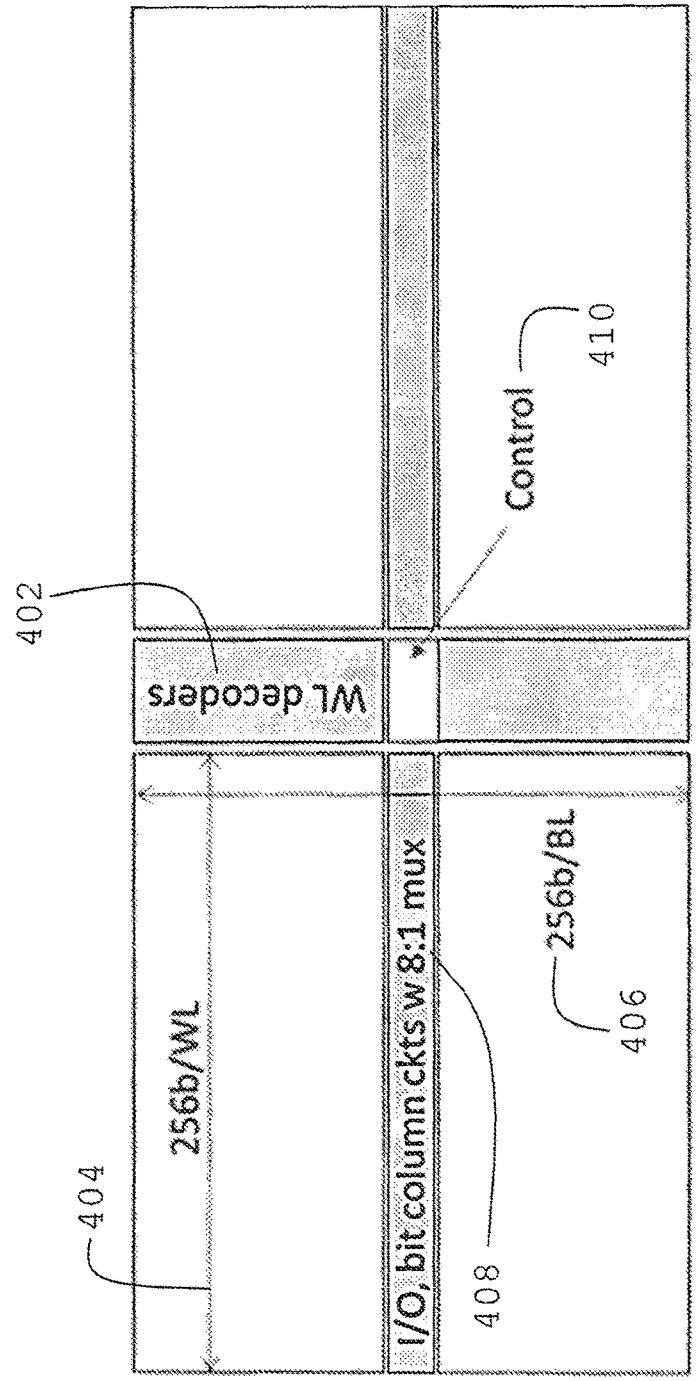

D. Array Architecture:

To be able to make quantitative comparisons between proposed circuits and those used by baseline industry standard designs, a simple, 128 Kb SRAM Array architecture (FIG. 4) from [27] is assumed with 256b/WL (404) on both sides of WL drivers at the center of the instance and 256b/BL, (406). The Read and Write access selects 64b using an 8:1 column multiplexer (408) Lateral and vertical dimensions of the array assume a 70% array efficiency where a 20% overhead in X and Y directions are assumed for peripheral circuits.

E. Variability Impact on Performance:

Variability in bitcell VT has impact on VMIN, on bitpath latency and on its uncertainty. Variability in sense amp transistors impacts bitpath latency and its uncertainty. Other contributions to bitpath latency and its uncertainty come from bitline leakage noise and Read assist schemes such as WLUD that substantially degrade bitpath latency and its uncertainty. Attempts to column multiplex along the BL during a Read access degrades the bitpath latency uncertainty even further.

3. SUMMARY OF THE INVENTION

CMOS harvesting circuits are disclosed for conventional 6T SRAM bitcell arrays enabling substantial improvements to SRAM access time, pipeline performance and to SRAM active and leakage energy consumption—without scaling operating voltages while also improving Read and Write margins using assist schemes at very low area and energy overhead by reusing circuits that harvest charge.

Active energy dissipation during an SRAM read access is lowered by use of novel sensing schemes that self-limit signal development on the BL without the energy overheads seen in conventional designs from sense-amp offsets, BL column leakage and uncertain read current. Improvements in access time are enabled by increasing the signal development rate on the BL—by comparing the rising electric potential of harvested charge with a decreasing BL voltage in a bitcell column using a novel and compact inverting amplifier with dynamic reset. This area and energy efficient scheme leveraging availability of harvested charge not only self-limits signal development on the BL to lower active power and improve read latency, but also eliminates most of the uncertainty of BL voltage signal from uncertain read current by using a capacitive divider. Charge harvested in each column of bitcells from a read/write access is moved to a local harvest grid with a fraction of the capacitance of the BLs accessed in the subarray, at a voltage closer to $V_{DD}$ and is readily tapped into during a following Write access lowering write energy consumption from the power grid by over 30%. Active or standby mode leakage is lowered by the raised voltage of the harvesting node in each column—that is discharged only before the WL selects—for all columns during a Read, and for half-select columns during a Write

4. BRIEF DESCRIPTION OF DRAWINGS

FIG. 1 (100): Schematic and FinFET based layout of a typical dense 6T SRAM cell with ONE fin for PG, PU, PD devices FIG. 2 (200): Presence of variability along SRAM bitpath increases signal development time and BL voltage swing—degrading read performance and read energy efficiency with conventional DSAs. Longer WL pulse widths become necessary to meet DSA timing requirements for slowest bitcell. All other bitcells have more time to discharge the BL and build larger signal, consuming more energy. The WL pulse width equals the minimum cycle time when large arrays support a pipelined L3 access [23], with the variability encountered in DSA schemes directly setting limits on pipeline SRAM performance FIG. 3 (300): Shows the net capacitance (326) of a conventional SRAM cell that is charged and discharged during Write Assist from lowering supply terminal voltage during a Write to improve Write Margins. Charging and discharging this net comes with the energy overhead of charging all transistor terminals electrically connected to this net identified with heavy grey lines shown in schematic of SRAM cell. The diffusion capacitance of the source terminals of the PFET, the diffusion capacitance of all 3 transistors connected to the storage node 'Bitx' and the gate input capacitance of the inverter transistors PU1 and PD1 together are about 4× larger than the BL terminal capacitance of the cell. The energy overhead to recover the voltage at the supply terminal is thus 4× the energy required for the same voltage swing on the BL FIG. 4: Shows (400) typical instance of large array building block [27] with 256b/BL & 256b/WL subarrays in a 128 Kb Macro.

Figure 3:
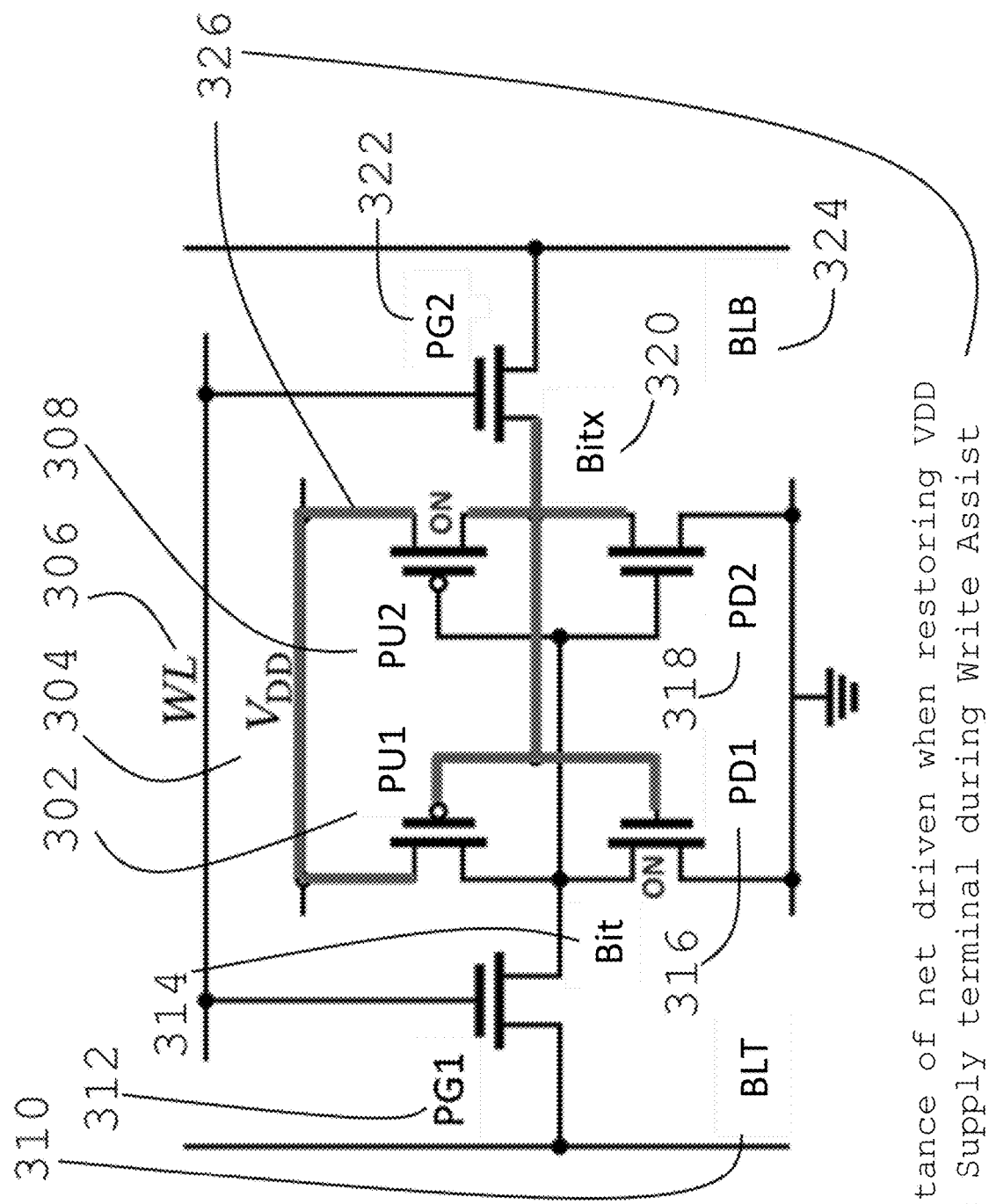
Figure 5:
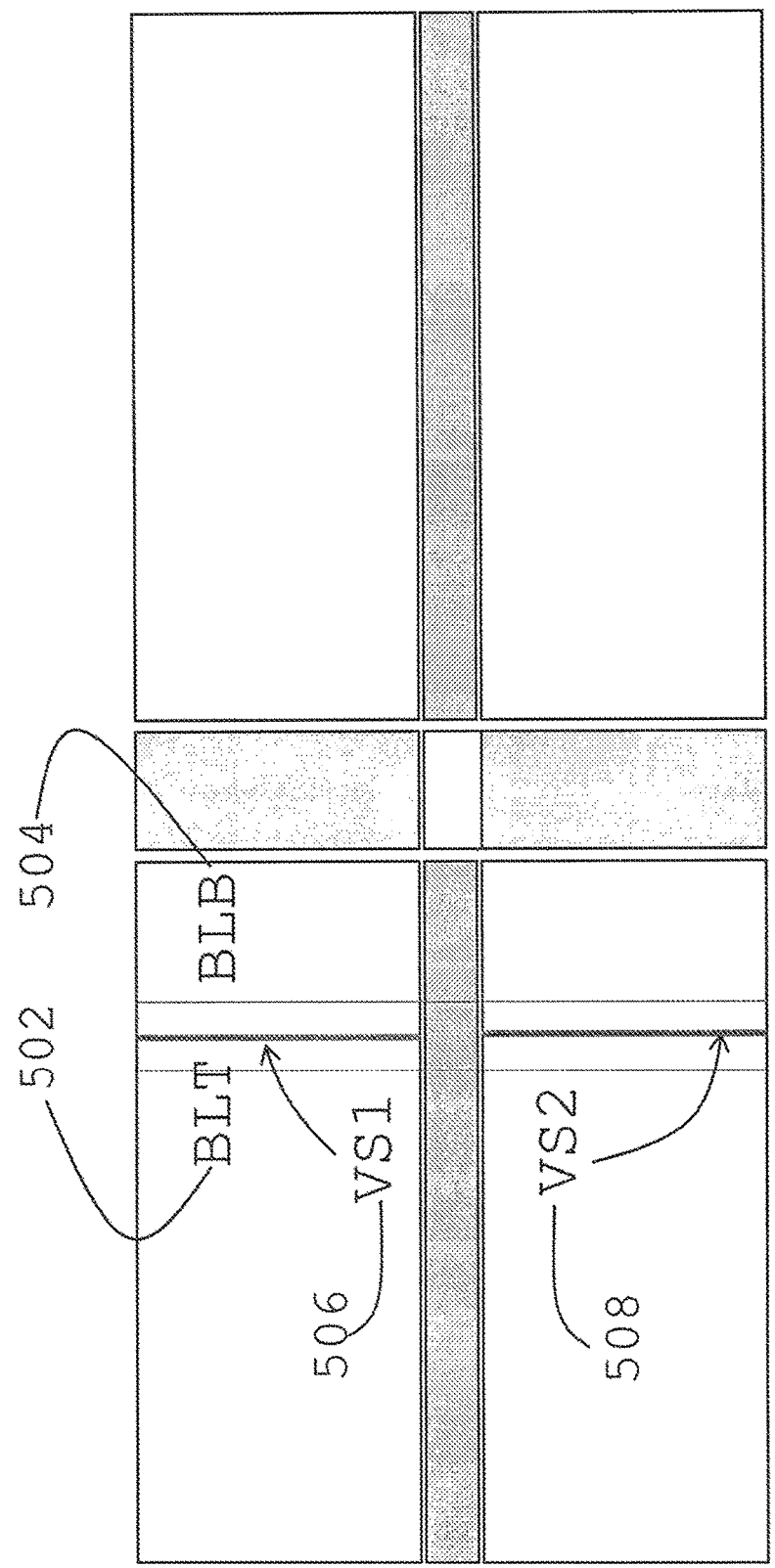

FIG. 5: This FIG. 500) shows the Harvest nodes VS1 and VS2 for the top and bottom half of the SRAM array in each column of bitcells. Relevantly, VS1 and VS2 are about half the length of the BL pairs in each column. The BL pair for each column of cells, as in [27] extends continuously from the top to the bottom of the instance. Bit column peripheral circuits in Proposed invention inserted in the middle of the instance—along center of BL columns to enable larger BL/VS1,2 capacitance divider ratio $C_{BL}:C_{VS1,2}$ of ~1:2. If BL and VS1, 2 had identical lengths, $C_{BL}:C_{VS1,2}$ would be 1:4 since the VSS terminal of the cell sees about 4× the capacitance as the BL terminal (as shown in FIG. 3)

Figure 6:
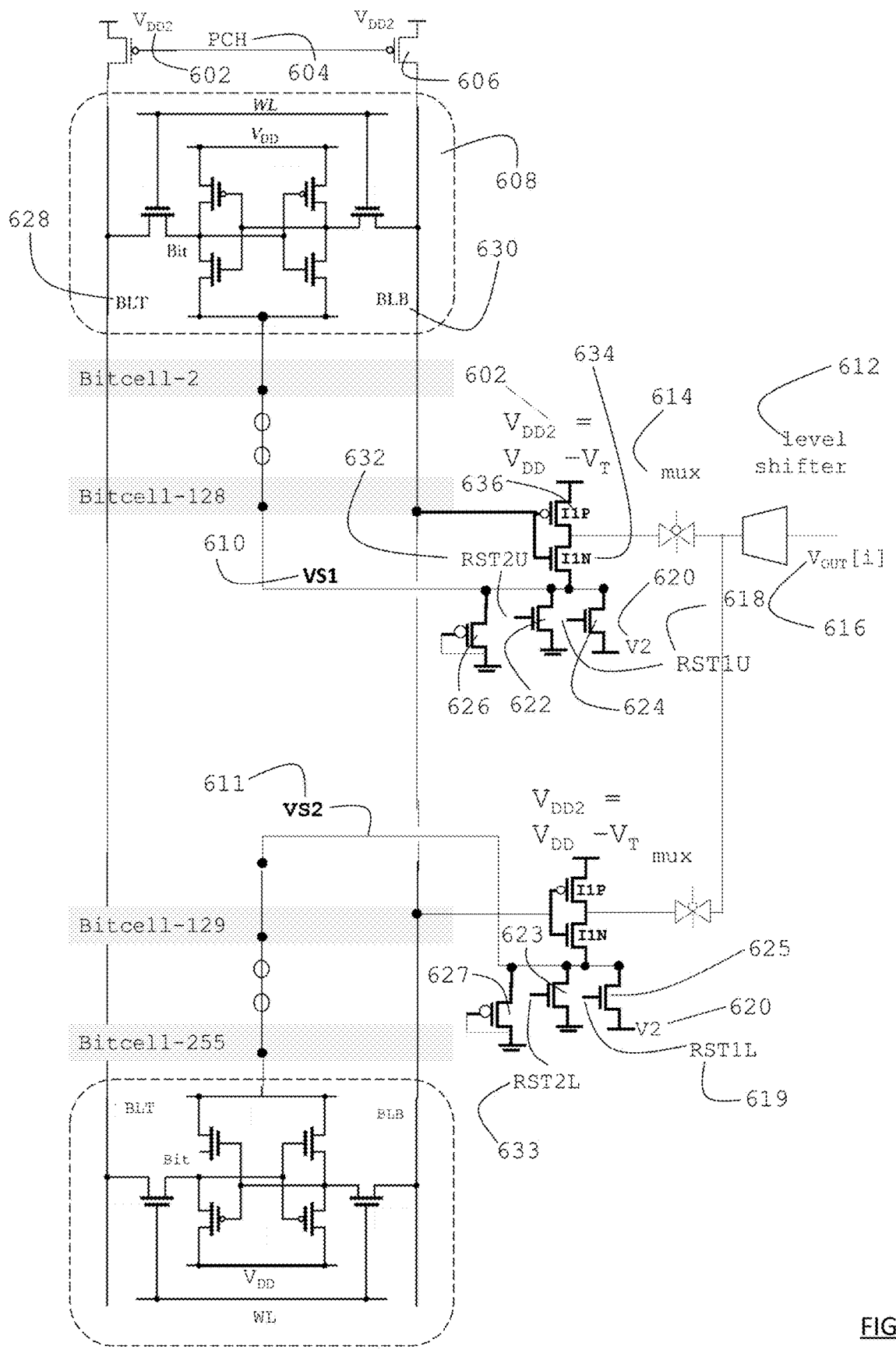
Figure 8:
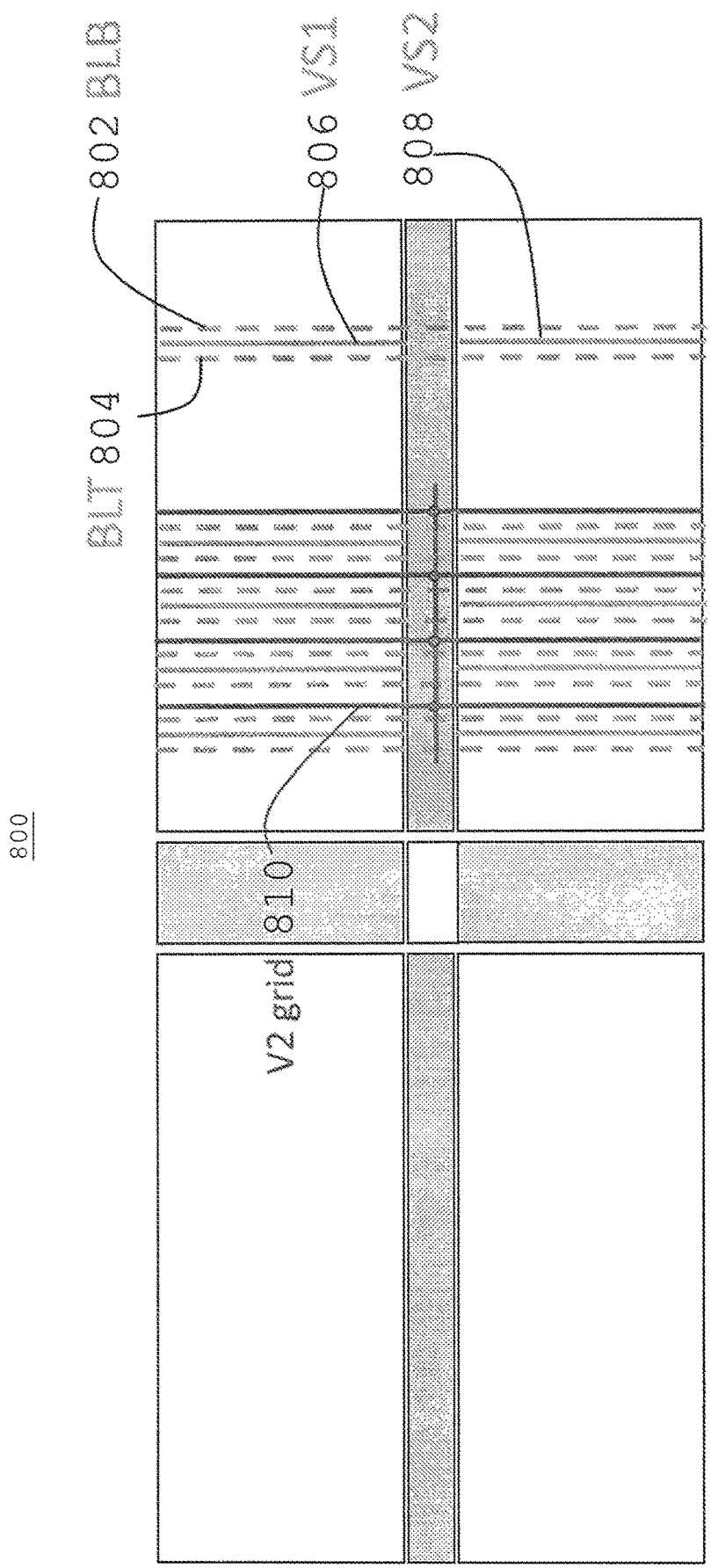

FIG. 6 (600): The proposed 6T SRAM Bitpath schematic harvests BL charge during a read access at the VS1/2 harvest nodes. Harvested charge enables a dynamic reset (with RST1L/U which discharges VS2/1 to the harvesting grid V2 (FIG. 8) followed by RST2L/U that flushes any remainder of harvested charge on VS2/1 to the Ground terminal). The proposed bitpath responds 2×faster than a conventional SRAM bitpath while seeing ⅓ to ½ of the sensing variance (FIG. 9) when compared to a conventional Differential Sense Amplifier. The voltage swing on the BL is fixed by capacitive divider b/w $C_{BL}$, and $C_{VS1,2}$ eliminating uncertainty in the magnitude of BL voltage signal development. The BL is precharged to VDD2—VT: a VT below VDD (i) to increase Read Noise Margin [13] by minimizing injected noise into the cell from the BL terminal and (ii) to lower the largest component of active SRAM power (BL Read). Note that 256 bitcells drive a single BL into 2 sensing inverters—one in the top half and the second in the bottom half with the lower inverter in the bottom subarray disabled with RST1L, RST2L=0 and VS2 pinned to a diode voltage (implemented with a PFET whose gate terminal is at GND) above GND (0.17-0.2V) when the top subarray is selected.

FIG. 7 (700): In the proposed SRAM bitpath shown in FIG. 6, Read access proceeds with the WL select transition without requiring timing enablement of sensing action. As the BL charge moves to VS1/2 (choice of VS1 or VS2 depending on the top or bottom subarray being selected by WL), the inverting amplifier output 'SAout' switches when the difference b/w the decreasing input to the inverting amplifier and it's increasing logic threshold intersect. The response is much faster, less vulnerable to variability and BL voltage signal swing is fixed—independent of read current variance compared to conventional Differential Sense Amplifier (DSA) based schemes. This because the signal development rate between the input of the inverting amplifier and its Source terminal at VS1/2 is twice that of the rate of signal development b/w the BL pair applied to inputs of a conventional DSA. The variance of the logic threshold is ⅓ to ½ of the variance of DSA offsets (shown in FIG. 9). Column multiplexing done at output of inverting Sense Amp as shown in FIG. 6 (and not at its input as in a conventional bitpath with DSA). The leakage noise is much less in proposed bitpath due to leakage suppression in unselected bitcells with negative gate-source voltage for PG NFETs in column as BL charge transfers to VS1 (as seen in waveforms in this Figure). Also, note that the output of the level shifter at the end of the bit path, Vout can switch within 200 ps of WL select despite 256b/BL. The maximum possible swing on BL is—330 mV. Note that larger WL pulse widths do not increase energy dissipation or the voltage swing of the BL from its self-limiting feature. The waveforms above and below correspond to data read from the bitcell of opposite polarity FIG. 8 (800): harvested charge on VS1 or VS2 (128 bitcells tall, in the running example embodiment) is shared with the V2 grid shown above by turning on NFET driven by gate input RST1U/L to share charge harvested on VS1/2 before a Read or Write Access begins. Assuming the 8:1 column multiplexor in the example array from FIG. 4, the ratio of capacitance on VS1 or VS2 to V2 would be (approx.) 1:4 since the V2 grid uses a bitcell column for each vertical V2 line in this example embodiment.

Figure 10:
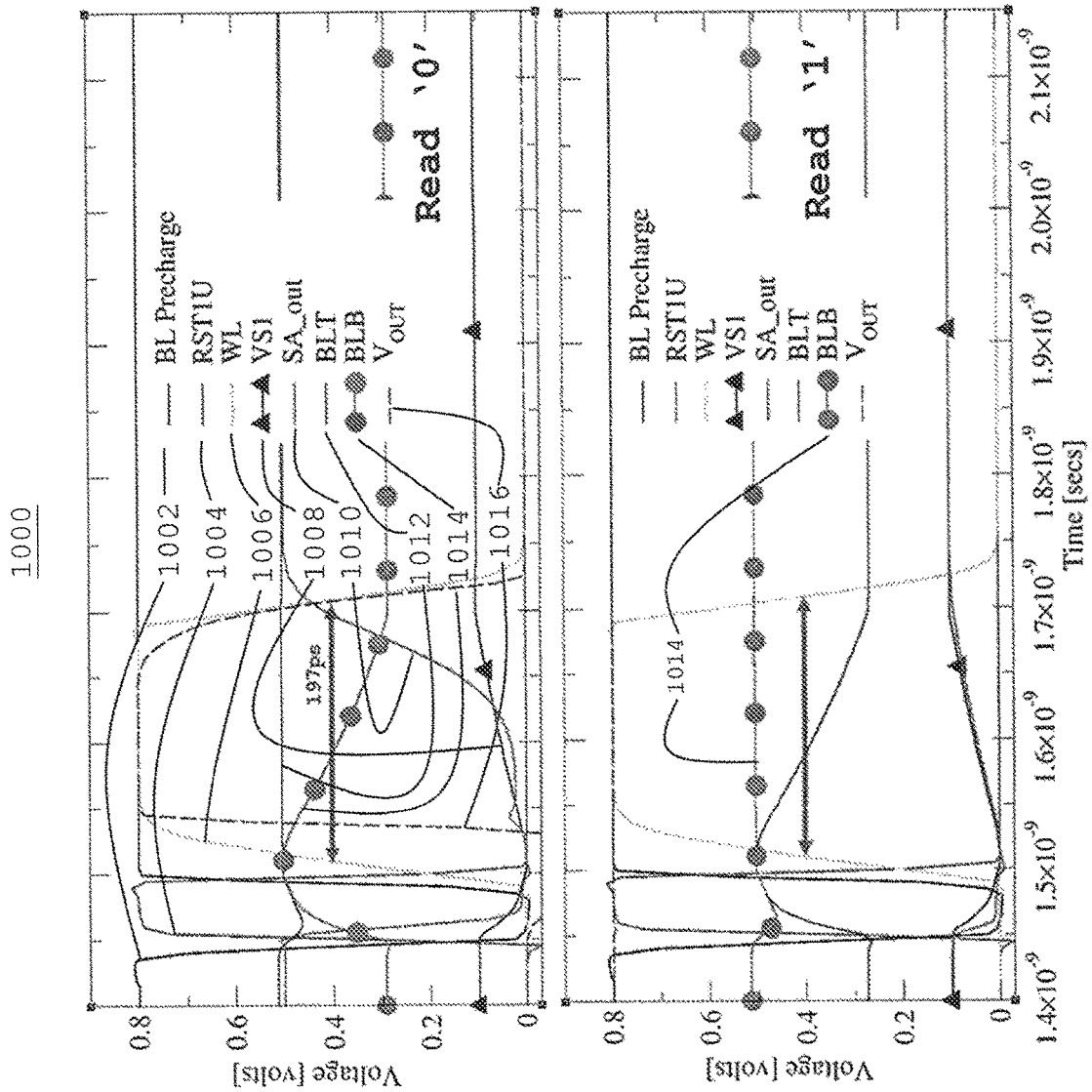

FIG. 9 (900): Simple analytical models to compare the variance of the logic threshold of an inverter with the DSA. Model demonstrates the inverter sees a variance of ⅓ to ½ compared to a conventional Differential Sense Amplifier for the same VT variability in both sensing schemes FIG. 10 (1000): Minimum SRAM pipeline cycle time is set by the WL pulse width [23]. The proposed scheme can shrink pulse width to narrower values, given faster sensing action, smaller BL signal swing, lesser variance seen from SA offsets, absence of noise from col mux and absence of leakage noise from unselected cells due to negative gate-source voltage of unselected cell pass gate devices. Note that at higher pipeline clock rates, the BL swing is smaller but sufficient for sensing action enabling higher energy efficiency during SRAM Read access than at slower clock rates. The waveforms above and below correspond to data read from the bitcell of opposite polarity FIG. 11 (1100): A comparision of voltage and current waveforms of the bitpath b/w use of conventional SRAM peripheral circuits (middle) and proposed ones (top). Voltage across cell NFET stack (PG-PD) in proposed scheme during signal development (voltage b/w BLB and VS1 waveforms in Figure) is almost half of that in a conventional SRAM due to Precharging BLs to a VT below VDD [13] and due to harvesting charge at VS1/2. Signal development rate on the BL is double (seen with more clarity in FIG. 12) in the proposed scheme even though cell read currents (bottom) are smaller in proposed scheme than c FIG. 12 (1200): Precharging BLs to a VT below VDD enables a lower voltage on the cell storage node during a Read access and therefore a larger SNM when compared to conventional SRAM arrays [13]. As BL signal develops in the proposed scheme, read current and cell storage node voltage drop even further improving cell SNM by 10% (at the start of the WL access) to over 20% (before the WL deselects), Unlike a conventional SRAM where cell storage node voltage or read current stays flat during WL select, proposed schemes increase cell immunity to noise until WL deselected (above, FIG. 10) or until the cell self-disables (FIG. 7). This without adding any transistors as area or energy overhead.

Figure 13:
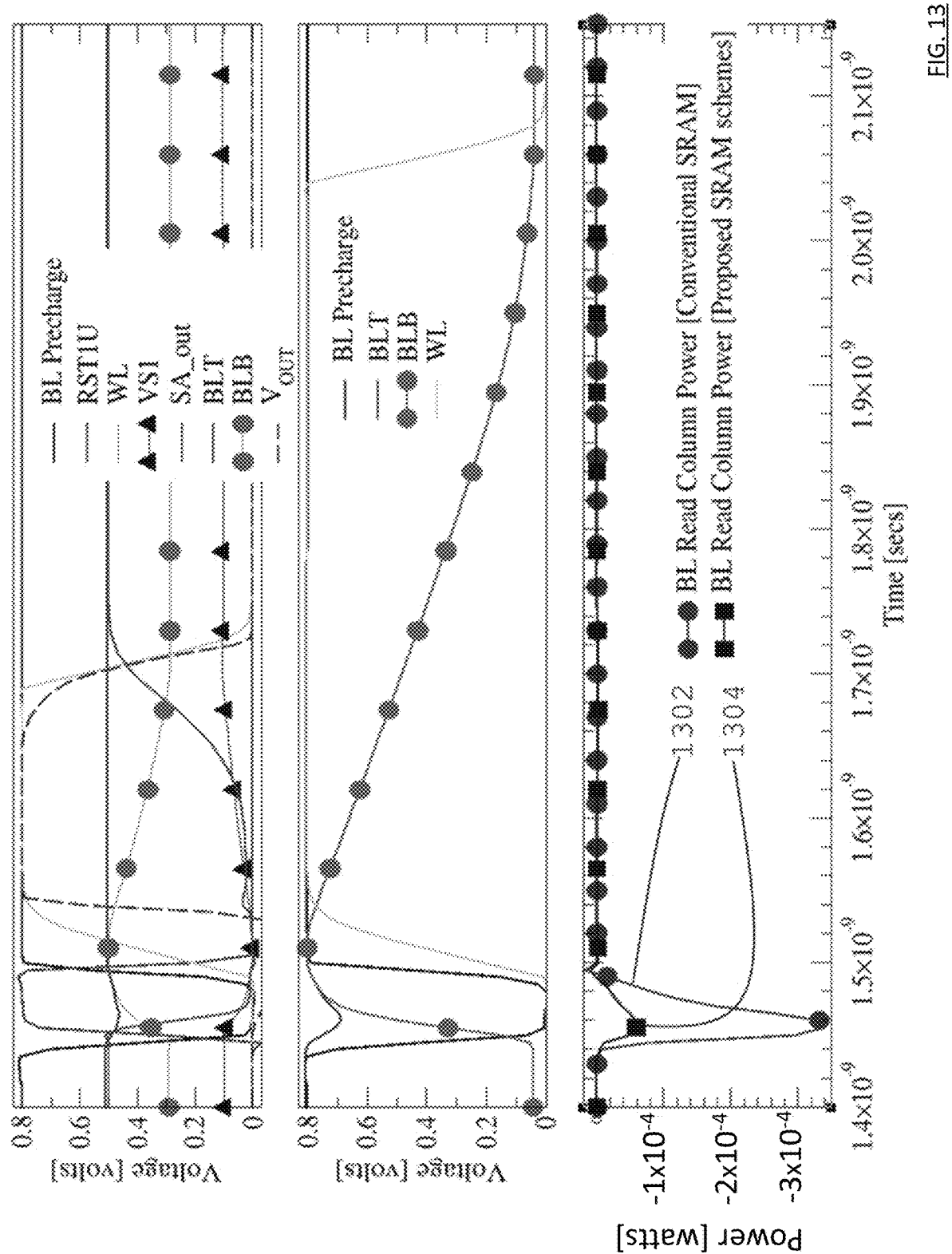

FIG. 13 (1300): BL power accounts for most of the total SRAM active power [33] for CIM applications—warranting a separate lower bitpath power supply (of 0.5V in this example). Proposed schemes show reduction in BL Column power from 16.7 fJ per column in conventional SRAM to 3.15 fJ using proposed scheme—a reduction by a factor of 5.3 or a reduction of 81%

Figure 14:
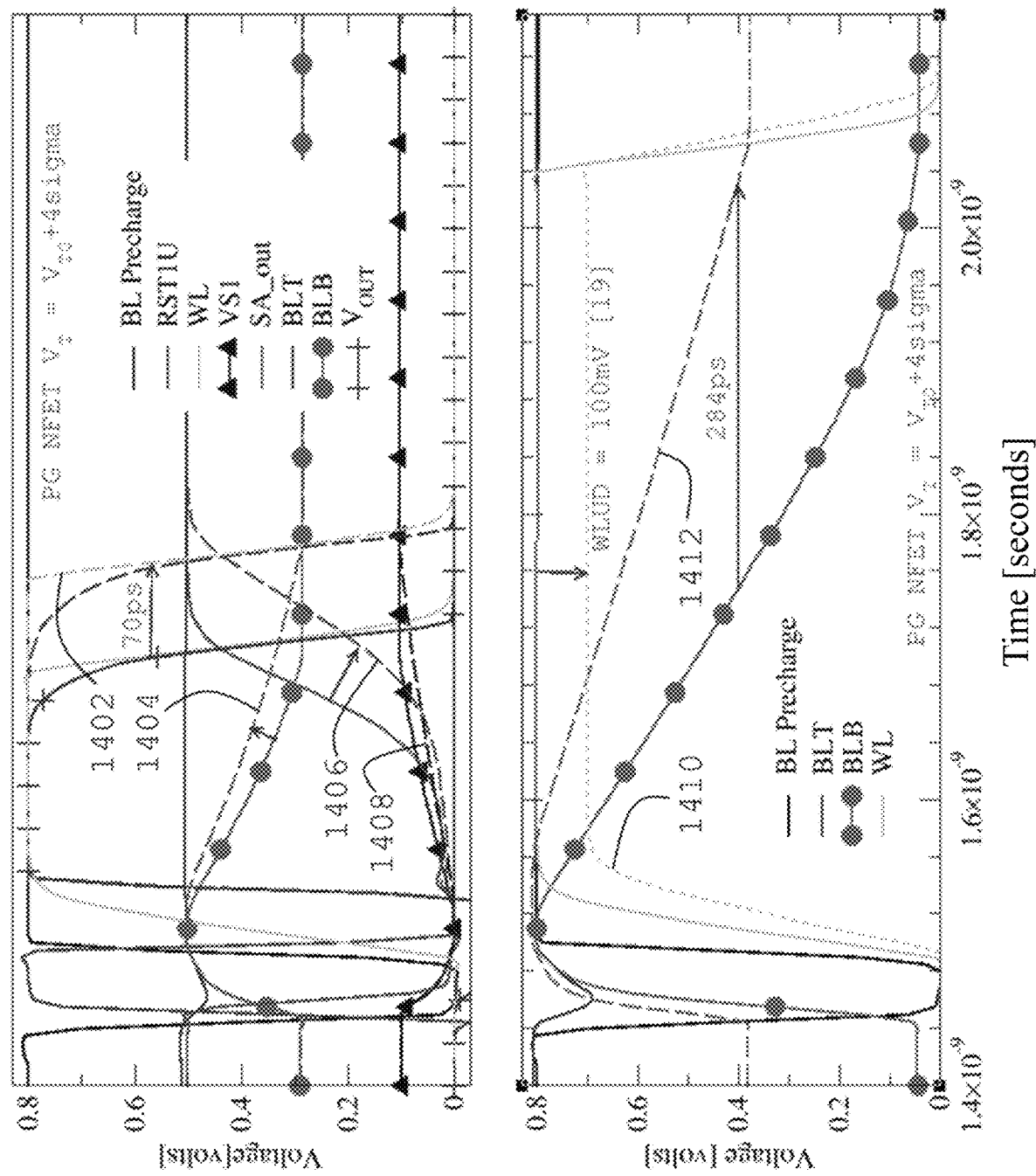

FIG. 14 (1400): Impact of variability and Read Assist schemes on performance: In conventional SRAM arrays, performance is limited by the worst case bitcell (assumed in this analysis with a 4a increase in PG NFET VT only). Reduction of gate overdrive with WLUD Read Assist schemes where the WL voltage is lower by 100 mV can contribute to additional performance degradation— seen above of 284 ps in BL signal development time compared to the 70 ps degradation in proposed scheme. Proposed scheme has a fourth of the performance penalty from bitcell variability.

5. DETAILED DESCRIPTION OF THE INVENTION AND DRAWINGS

A. Proposed Bitpath:

The 6T SRAM Bitpath schematic (FIG. 6, 600) harvests BL charge during a read access at the VS1,2 (610, 611) terminals. Harvested charge enables the inverting amplifier {I1P (636), I1N (634)) with dynamic reset (R571 (632/633), RST2(618/619))} to respond 2× faster while seeing ⅓ to ½ of the variance when compared to a DSA. The voltage swing on the BL is fixed by capacitor divider b/w $C_{BL}$ and $C_{VS1,2}$ eliminating uncertainty of BL signal development. The BL precharges (604) through PFETs 606 from VDD2 (602): a supply voltage a VT below VDD to increase SNM by minimizing injected noise into the cell from BL terminal and to lower the largest component of active SRAM power (BL precharge)

FIG. 5 (500) and FIG. 6 (600) show that the VS1,2 (506, 508) charge harvesting nodes are less than half the length of the BL pair (BLT, BLB) and are connected to half as many bitcells as the BL pair—BLT and BLB (502, 504). This permits a larger BL/VS1,2 capacitance divider ratio $C_{BL}$:$C_{VS1,2}$ of ~1:2. If BL and VS1,2 had identical lengths, $C_{BL}$:$C_{VS1,2}$ would be 1:4 since the VSS terminal of the cell sees about 4× the capacitance as the BL terminal (shown similarly for the VDD terminal in FIG. 3)

Thus, a BL twice as long as VS can be expected to see a VS1,2 to BL capacitance ratio of 2:1 and thus see (a discharged) VS1,2 rise to a voltage ⅓ of the precharge voltage on the BL. In FIG. 7 {700), with a precharge voltage of 0.5V, the charge harvesting node VS1 thus rises to ⅓ of 0.5V=0.167 V This harvested charge on VS1 or VS2 (128 bitcells tall, in the running example embodiment) is shared with the V2 grid (810) shown in FIG. 8 (800) by turning on NFET (624 or 625 in FIG. 6) driven by gate input RST1U or RST1L (618 or 619) to share charge harvested or VS1 to V2) before a Read or Write Access begins. Assuming the 8:1 column multiplexer in the example array from FIG. 4, the ratio of capacitance on VS1 or VS2 to V2 would be 1:4 since the V2 grid uses a bitcell column for each V2 line. In this example array architecture of a large 6T SRAM cell array the 256-bit long bitline pair is directly driven for Read and Write operations without a BL hierarchy. For a Write that follows a Read, each bitline pair could harvest the charge on the BL in the pair that is intended to be driven to a '0'. This is accomplished by comparing the present voltage of the BL with the data_in voltage to selectively discharge the BL in the pair to V2, Since Write latency is less than for a Read access (which has a larger latency than a Write due to sensing action) the delay overhead in comparing old Vs new values of BL voltage to selectively discharge the BL in the pair does not increase 6T SRAM cycle time or its pipeline performance.

Charge harvested from VS1,2 in each column to V2 following a Read access and from the BL pair before a Write access is used by write drivers to write to the BL pair during a Write access as is described in Utility application Ser. No. 17/578,422, Conf Number 3764, "Fast, Energy Efficient CMOS 2P1R1W Register File Array using Harvested Data"

In the proposed SRAM scheme, a Read access proceeds with the WL select transition (706) without requiring timing enablement of sensing action. As the BL charge moves to VS1 (708) (FIG. 7, 700), the inverting amplifier output 'SA_out' (710) switches from GND to VDD2 when the difference b/w the decreasing input (630) to the inverting amplifier and it's increasing logic threshold intersect, as VS1's (610) voltage rises with harvested charge. The amplifier response is faster, less vulnerable to variability and the signal swing at it's output is fixed—independent of read current variance when compared to conventional DSA based schemes. This because (i) the signal development rate between the input of the inverting amplifier and its source terminal (VS1(610) or VS2(611)) is twice that of the rate b/w DSA inputs in the conventional bitpath, (ii) the variance of the logic threshold is ⅓ to ½ of the variance of DSA offsets (FIG. 9, 900), (iii) column multiplexing (614) done at output of SA (and not at its input as in a conventional bitpath) and (iv) BL leakage noise much less due to leakage suppression with negative gate-source voltage for PG NFETs of all unselected cells in bitcell column as BL charge transfers to VS1. Also, note that the output, Vout can switch within 200 ps of WL select despite 256b/BL and that maximum possible swing on BL is ~330 mV and not as large as VDD, expected in conventional designs from margining requirements discussed in FIG. 2. Note that larger WL pulse widths do not increase energy dissipation in the proposed scheme since the read current flow self-disables when VS1 or VS2 rise to within a cell NFET VT of the BL voltage.

VS1/VS2 are the harvest nodes that store evaluation charge. The ground terminal of the bitcells in the column are connected to this common harvest node. So, when a cell is selected to read, charge from the BL moves to VS1 raising its voltage (that was reset to GND with RST1 and RST2 directly before a Read begins), When VS1 rises to within a VT of the decreasing BL voltage, there isn't enough overdrive on the PG NFET in the selected bitcell to keep it turned on. Hence the self-disabling of a Read access. Stored charge is used to disable the bitcell exactly when it is no longer needed to build signal on the BL. By self-disabling the cell access, bitlines do not continue discharging even though the WL is still selected. This self-disabling feature contributes to a large reduction of otherwise lost energy in conventional SRAM arrays B. Pipeline Performance:

Minimum SRAM pipeline cycle time is set by the WL pulse width [23]. The proposed scheme can scale pulse width to lower values (FIG. 10, 1000) given (i) faster sensing action, (ii) smaller BL signal swing, (iii) smaller variance seen in logic threshold variability (iv) absence of noise from col mux in proposed bitpath (since the column multiplexing is accomplished at the output of the sensing scheme in proposed bitpath in FIG. 6 (600, 601) and not along the bit line itself as in a conventional bit path) and (v) lower leakage noise from unselected cells in a column of bitcells. Note that from FIG. 10, at higher pipeline clock rates, the BL swing is smaller than observed in FIG. 7 (700) but sufficient for sensing action enabling higher energy efficiency during SRAM Read access than at slower clock rates.

Figure 11:
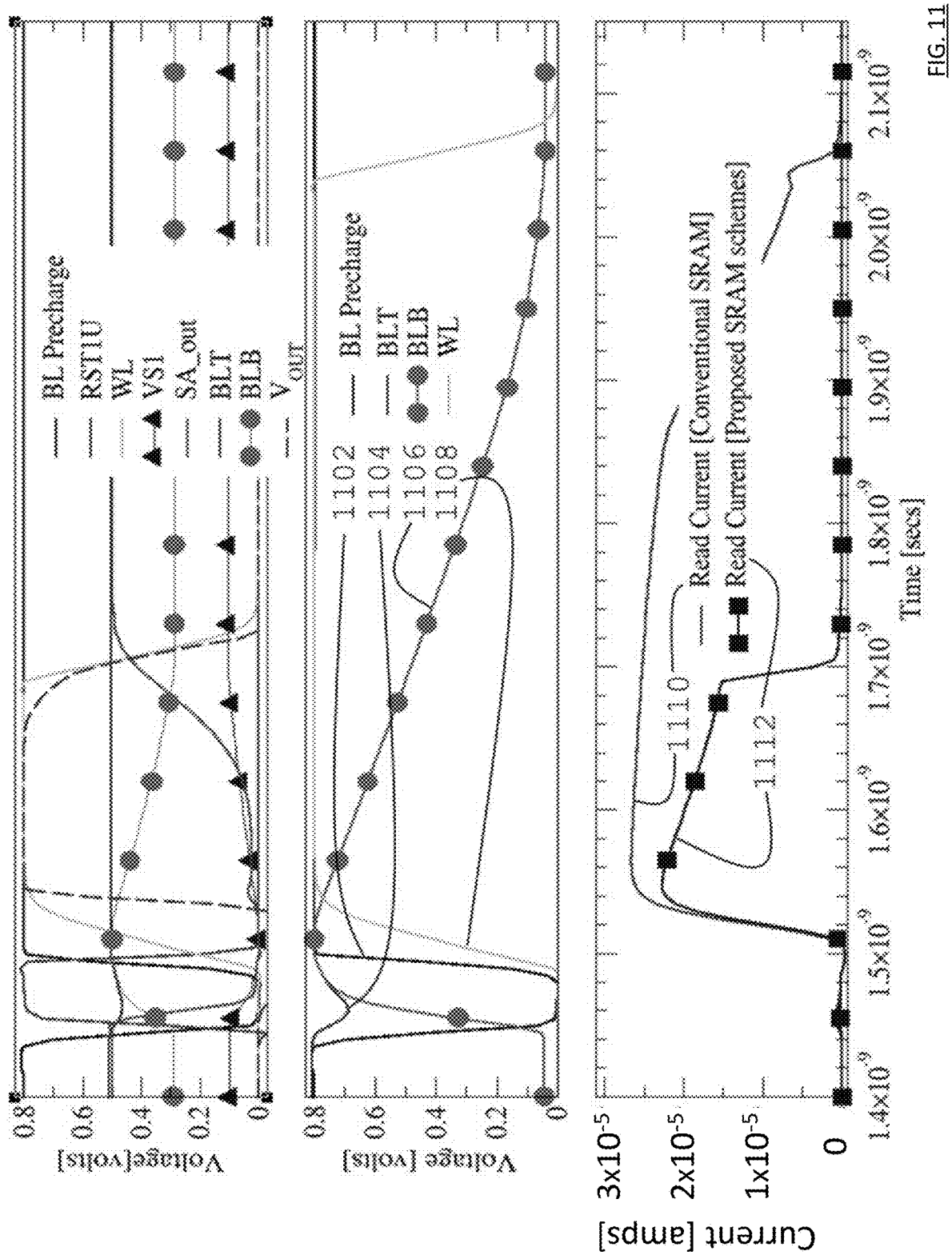
Figure 12:
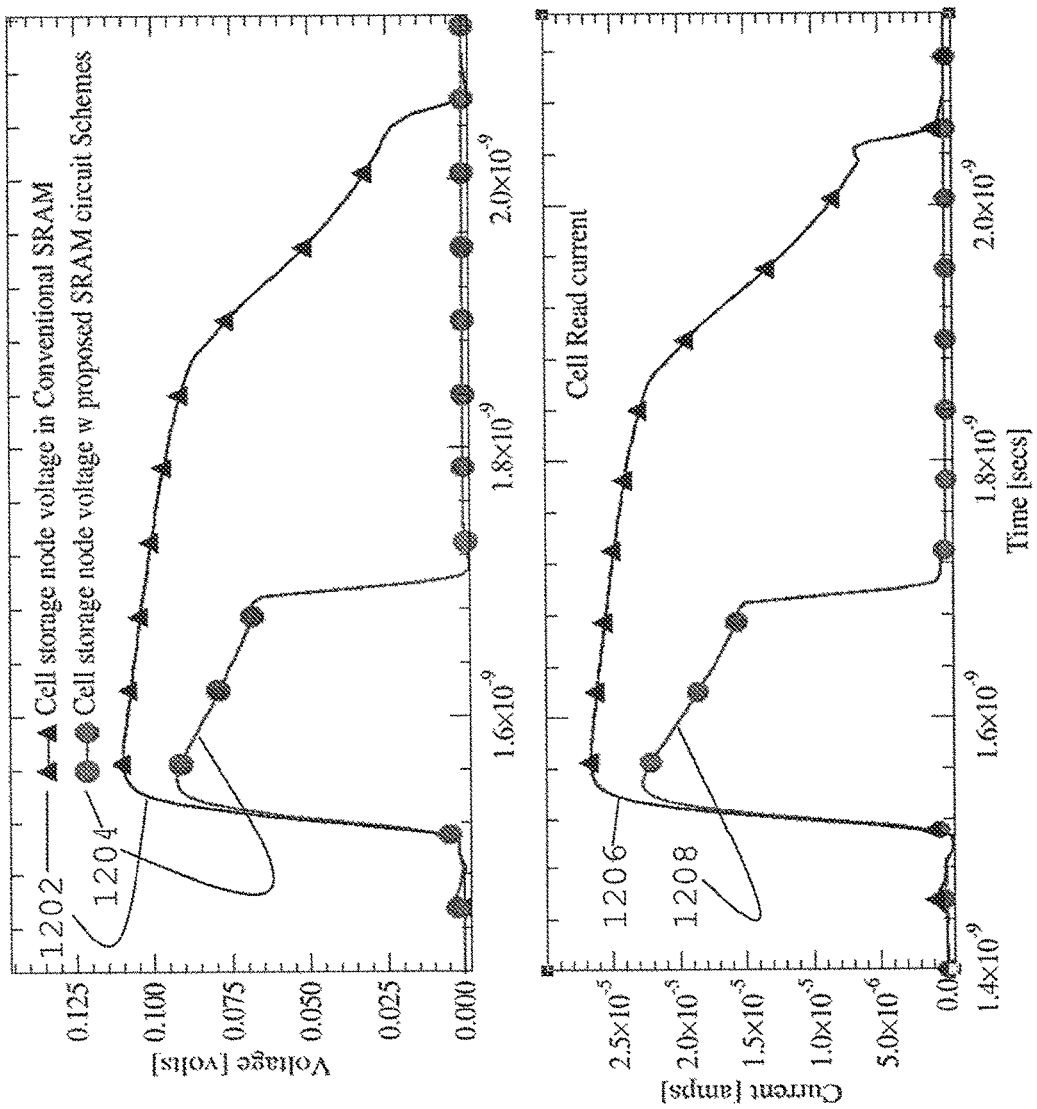

C. Comparison with Conventional SRAM:

FIG. 11 (1100) compares voltage and current waveforms of the bitpath of a conventional SRAM (middle) with proposed schemes (top). Voltage across the cell NFET stack (PG-PD)—between BLB and VS1, is almost half of that in a conventional SRAM (BLB and GND) while the signal is being developed in proposed scheme. Cell read currents (bottom) are smaller in proposed scheme than in conventional SRAMs because the voltage across the read stack is almost half that in a conventional bitpath. Lower read current helps cell stability during read since less noise is injected into the cell when selected by the WL. The sense action is much faster in proposed scheme since sensing is dual ended b/w BLB and VS1 in FIG. 11 (1100).

D. Read Assist in Proposed Bitpath:

Precharging BLs (628, 630) to a VT below VDD (602) in FIG. 6 (600, 601) allows a lower voltage on the cell storage node during a Read access and therefore a larger SNM when compared to conventional SRAM arrays.

Moreover, as BL signal develops in the proposed scheme (FIG. 12), read current (1208) and cell storage node voltage (1204) drop even further improving cell SNM by 10% at the start of the WL access to over 20% before the WL deselects. Unlike the conventional SRAM operation where cell storage node voltage (1202) or read current (1206) stay mostly flat during WL select, proposed scheme increases cell immunity to noise until WL deselected (FIG. 10) (1000) or until the cell self-disables (FIG. 7). (700) This without adding any transistors as area or energy overhead E. Energy Efficiency in Proposed Scheme:

FIG. 13 (1300) compares time dependent power dissipation between conventional (1302) and proposed (1304) schemes (area under power equals total energy consumed per column). BL power accounts for over half of the total SRAM active power typically when 128-256 bit columns, (each 256-512 bits long) are accessed concurrently to develop signal warranting a separate lower bitpath power supply (of 0.5V in this example). Lower Bitpath power supply is advantages because (i) performance is higher due to smaller voltage swing (ii) active power is lower (iii) SNM improves due to lower noise injected into cell and (iv) easier to interface SRAM data with logic—that generally has lower VMIN than SRAM. Proposed schemes show reduction in BL Column power from 16.7 fJ per column in conventional SRAM to 3.15 fJ using proposed scheme—a reduction by a factor of 5.3 or a reduction of 81%

F. Impact of Variability and Read Assist Schemes on Performance:

In conventional SRAM arrays, performance is limited by the worst case bitcell (assumed in simulation shown in FIG. 14 (1400) with a 4a increase in PG NFET VT only). Reduction of gate overdrive by 100 mV with WLUD Read Assist schemes [19] is also assumed in the conventional SRAM simulation. WLUD can contribute to additional performance degradation seen cumulatively in FIG. 14 as 284 ps in BL signal development time compared to the 70 ps degradation in proposed scheme. Proposed scheme has 4× lower performance overhead from variability of bitcell VT.

4. REFERENCES

[1] Irma Esmer Papazian, "Next Generation Intel Xeon(R) Scalable Server Processor: Icelake-SP", Hot Chips 32, August 2020

[2] Sonu Arora, "AMD Next Generation 7 nm Ryzen™ 4000 APU", Hot Chips 32, August 2020

[3] J. Choquette et al, "The A100 Datacenter GPU and Ampere Architecture", 2021 ISSCC Dig. of Tech. papers, February 2021

[4] C. Schmidt et al, "An Eight-Core 1.44 GHz RISC-V Vector Machine in 16 nm FinFET", 2021 ISSCC Dig. of Tech. papers

[5] T Norrie et al, "The Design Process for Google's Training Chips: TPUv2 and TPUv3", IEEE Micro, Vol 41, Issue 2, March/April 2021

[6] Sean Lie, "Wafer Scale Deep Learning" Hot Chips 31, August 2019

[7] Raja Koduri, "No Transistor Left Behind", Intel Keynote Hot Chips

[8] She Jia et al, Dissecting the Graphcore IPU Architecture via Microbenchmarking, Technical Report, December 2019.

[9] J. Deng et al, "5G and AI Integrated High Performance Mobile SoC Process-Design Co-Development and Production with 7 nm EUV FinFET Technology", 2020 IEEE Symposium on VLSI Tech., June 2020

[10] B Barry et al, "Always-on Vision Processing Unit for Mobile Applications" IEEE Micro, Vol 35, Issue 2, March/April 2015

[11] G. Yeap et al, "5 nm CMOS Production Technology Platform featuring full-fledged EUV, and High Mobility Channel FinFETs with densest 0.021 mm2 SRAM cells for Mobile SoC and High-Performance Computing Applications", 2019 IEDM, pp. 36.7.1-36.7.4

[12] M. Bohr et al, "CMOS Scaling Trends and Beyond", IEEE Micro, Vol 37, Issue 6, pg 20-29, November/December 2017,

[13] A. Bhavnagarwala et al, "Fluctuation limits & scaling opportunities for CMOS SRAM cells", 2005. IEDM Technical Digest, pp. 659-662, December 2005.

[14] K. Shang, "Circuit Design in Nano-Scale CMOS Technologies", 2018 IEEE Asian Solid-State Circuits Conference (A-SSCC), pp. 1-4, November 2018.

[15] A. Bhavnagarwala et al, "A 400 mV active VMIN, 200 mV retention VMIN, 2.8 GHz 64 Kb SRAM with a 0.09 um2 6T bitcell in a 16 nm FinFET CMOS process", 2016 Symposium on VLSI Circuits

[16] F. Tachibana et al, "A 27% Active and 85% Standby Power Reduction in Dual-Power-Supply SRAM Using BL Power Calculator and Digitally Controllable Retention Circuit", IEEE Journal of Solid-State Circuits, vol. 49, no. 1, pp. 118-126, January 2014

[17] M. Sinangil et al., "Application-Specific SRAM Design Using Output Prediction to Reduce Bit-Line Switching Activity and Statistically Gated Sense Amplifiers for Up to 1.9×Lower Energy/Access", IEEE Journal of Solid-State Circuits, vol. 49, no. 1, pp. 107-117, January 2014

[18] M. Sinangil et al, "A 28 nm 2 Mbit 6 T SRAM With Highly Configurable Low-Voltage Write-Ability Assist Implementation and Capacitor-Based Sense-Amplifier Input Offset Compensation", IEEE Journal of Solid-State Circuits, vol. 51, no. 2, pp. 557-567, February 2016

[19] Z Guo, "A 23.6-Mb/mm2 SRAM in 10-nm FinFET Technology with Pulsed-pMOS TVC and Stepped-WL for Low Voltage Applications", IEEE Journal of Solid-State Circuits, vol. 54, no. 1, pp. 210-216, January 2019

[20] K Agawa et al, "A bitline leakage compensation scheme for low-voltage SRAMs", IEEE Journal of Solid-State Circuits, vol. 36, no. 5, pp. 726-734, May 2001

[21] B Wicht et al, "Yield and Speed Optimization of a Latch-Type Voltage Sense Amplifier", IEEE Journal of Solid-State Circuits, vol. 39, no. 7, pp. 1148-1158, July 2004.

[22] A. Kawasumi et al, "Energy Efficiency Deterioration by Variability in SRAM and Circuit Techniques for Energy Saving without Voltage Reduction", 2012 IEEE International Conference on IC Design & Technology, 2012, pp. 1-4

[23] Y Wang et al, "A 4.0 GHz 291 Mb Voltage-Scalable SRAM Design in a 32 nm High-k+Metal-Gate CMOS Technology with Integrated Power Management", IEEE Journal of Solid-State Circuits, vol. 45, no. 1, pp. 103-110, January 2010

[24] E Karl et al, "A 4.6 GHz 162 Mb SRAM Design in 22 nm Tri-Gate CMOS Technology with Integrated Active VMIN-Enhancing Assist Circuitry", 2012 ISSCC Dig. of Tech Papers, pp 230-232, February 2012

[25] E Karl et al, "A 0.6 V, 1.5 GHz 84 Mb SRAM in 14 nm FinFET CMOS Technology with Capacitive Charge-Sharing Write Assist Circuitry", IEEE Journal of Solid-State Circuits, vol. 51, no. 1, pp. 222-229, January 2016

[26] Y-H Chen et al, "A 16 nm 128 Mb SRAM in High-K Metal-Gate FinFET Technology with Write-Assist Circuitry for Low-VMIN Applications", 2014 ISSCC Dig. of Tech Papers, pp 238-240, February 2014

[27] Y-H Chen et al, "A 16 nm 128 Mb SRAM in High-Metal-Gate FinFET Technology With Write-Assist Circuitry for Low-VMIN Applications", IEEE Journal of Solid-State Circuits, vol. 50, no. 1, pp. 170-177, January 2015

[28] Z Guo et al, "10-nm SRAM Design Using Gate-Modulated Self-Collapse Write-Assist Enabling 175-mV VMIN Reduction with Negligible Active Power Overhead", IEEE Solid-State Circuits Letters, vol. 4, pp. 6-9, 2021

[29] T-Y Chang et al, "A 5-nm 135-Mb SRAM in EUV and High-Mobility Channel FinFET Technology with Metal Coupling and Charge-Sharing Write-Assist Circuitry Schemes for High-Density and Low-VMIN Applications", IEEE Journal of Solid-State Circuits, vol. 56, no. 1, pp. 179-187, January 2021

[30] J. Meindl et al, "The impact of stochastic dopant and interconnect distributions on gigascale integration", ISSCC. Digest of Technical Papers, 1997, pp. 232-233

[31] Shien-Yang Wu et al, "An Enhanced 16 nm CMOS Technology Featuring 2nd Generation FinFET Transistors and Advanced Cu/low-k Interconnect for Low Power and High-Performance Applications" 2014 IEEE International Electron Devices Meeting, 2014, pp. 3.1.1-3.1.4.

[32] Predictive Technology Model [PTM] at ASU, http://ptm.asu.edu/latest.html

[33] M Kang et at, "Deep In-memory Architectures for Machine Learning", Springer 2020

The invention claimed is:

1. A transistor memory device, comprising:
a plurality of transistor storage elements that share a common source or ground terminal, the common source or ground terminal (1) reset to a reference ground potential of the transistor memory device directly before a read data access and a write data access and (2) electrically decoupled from the reference ground potential of the transistor memory device during the read data access and during the write data access.

2. The transistor memory device of claim 1, wherein the plurality of transistor storage elements that share the common source or ground terminal store charge on a collective capacitance includes (1) a total capacitance of the common source or ground terminal, the common source or ground terminal connected to each other identified as a harvest node and (2) a capacitance of a storage node in a transistor storage element from the plurality of transistor storage elements, each transistor storage element from the plurality of transistor storage elements including a word line port configured to select (a) a transistor storage element from the plurality of transistor storage elements and (b) at least one bitline, each transistor storage element from the plurality of transistor storage elements configured to perform (i) the read data access from or (ii) the write data access to that transistor storage element, the harvest node configured to store a harvested charge transferred from the selected bitline to increase an output voltage at the harvest node during the read data access or the write data access, the harvest node electrically coupled to a harvest circuit.

3. The transistor memory device of claim 2, further comprising:
a capacitive divider electrically connected between the selected bitline and the harvest node, the capacitive divider configured to increase a voltage swing on the harvest node within a predefined limit to retain data in all transistor storage elements from the plurality of transistor storage elements except in transistor storage elements from the plurality of transistor storage elements selected for a write data access, the capacitive divider configured to maximize an increase in an electric potential the harvest node will rise to during the read data access or the write data access to (i) increase an effective signal development rate as a voltage difference between selected bitline and the harvest node, with less read current (ii) lower active and leakage energy during the read data access or the write data access or (iii) reduce an uncertainty in voltage signal development on the selected bitline and the harvest node during the read data access.

4. The transistor memory device of claim 2 wherein:
the collective capacitance is determined by and proportional to (1) a number of transistor storage elements from the plurality of transistor storage elements that share the common source or ground terminal and (2) the storage node capacitance of the selected transistor storage element,
a bitline capacitance determined by and proportional to a number of transistor storage elements from a plurality of transistor storage elements shared by a common bitline.

5. The transistor memory device of claim 3 wherein the selected bitline is configured to be pre-charged to a voltage less than a voltage source coupled to a supply voltage terminal of a plurality of transistor storage elements shared by a common bitline.

6. The transistor memory device of claim 3 wherein the selected bitline is configured to be pre-charged to a voltage equal to a voltage source coupled to a supply voltage terminal of a plurality of transistor storage elements shared by a common bitline.

7. The transistor memory device of claim 6 wherein the capacitive divider between the collective capacitance and a bitline capacitance is configured to maximize an increase in the electric potential of the harvest node during the read data access or the write data access.

8. The transistor memory device of claim 3 wherein the harvest circuit includes an inverter with two parallel NFET footer devices in parallel to a PFET footer device with a gate input of the inverter is electrically connected to the common bitline and a source terminal of the inverter electrically is connected to the harvest node.

9. The transistor memory device of claim 8 wherein the harvest circuit is activated with a first active high pulse and a second active high pulse that does not overlap with the first active high pulse and that drive gate inputs of a first parallel NFET footer device from the two parallel NFET footer devices and a second parallel NFET footer device from the two parallel NFET footer devices, respectively, directly before the read data access or the write data access.

10. The transistor memory device of claim 9 wherein a first NFET footer device whose drain terminal is connected to the harvest node and whose source terminal is connected to a harvest grid, is enabled by an active high pulse at a gate input of the first NFET footer to transfer charge from the harvest node to the harvest grid while lowering the electric potential of the harvest node to equal a rising electric potential of the harvest grid, the harvest grid including a network of capacitors from metal wiring included in transistor memory device, it's a harvest grid configured to accumulate charge from a plurality of harvest nodes that includes the harvest node included in the transistor memory device.

11. The transistor memory device of claim 10 wherein a second NFET footer device whose drain terminal is connected to the harvest node and whose source terminal is connected to a reference ground terminal of the transistor memory device, is enabled by a second active high pulse at a gate input of the second NFET footer device that is non-overlapping with and directly follows a first active high pulse discharging a remainder of charge held at the harvest node to the reference ground terminal of the transistor memory device bringing the electric potential of the harvest node to equal the reference ground electric potential of the transistor memory device directly before the read data access or the write data access.

12. The transistor memory device of claim 11 wherein the harvest circuit responds to the read data access with a word line selecting a subset of transistor storage elements from the plurality of transistor storage elements such that charge on each precharged bitline coupled to the subset of transistor storage elements is shared through and by the subset of transistor storage elements with the harvest node associated with the subset of transistor storage element, the plurality of harvest nodes coupled to the subset of transistor storage elements being reset to the reference ground potential of the transistor memory device before the word line selects the subset of transistor storage elements for the read data access.

13. The transistor memory device of claim 11 wherein a PFET device in parallel to the first NFET footer device and the second NFET footer device is configured to operate as a diode and bleed away charge from the harvest node during a predetermined period of inactivity.

14. The transistor memory device of claim 7 wherein a decreasing electric potential of the selected bitline self-limits passage of the read current through the selected transistor storage element as a voltage difference between the decreasing electric potential of the selected bitline and a rising electric potential of the harvest node approaches a transistor threshold voltage at which point the selected transistor storage element self-disables passage of the read current even if the transistor storage element is still selected by a word line enabling uncertainty of voltage signal on the selected bitline to be mostly eliminated.

15. The transistor memory device of claim 8, wherein an increasing electric potential of the harvest node causes a logic threshold voltage of the inverter in the harvest circuit to rise enabling a smaller voltage drop on the selected bitline to trigger a transition at an output of the inverter of the harvest circuit sooner than in an inverter with a static logic threshold voltage.

16. The transistor memory device of claim 14, wherein an increasing electric potential of the harvest node, electrically connected to a source terminal or a ground terminal of the plurality of transistor storage elements, an elevated electric potential of the harvest node lowers subthreshold leakage from access NFET transistors in unselected transistor storage elements that share a common harvest node with the selected transistor storage element, reverse biases substantially lowering a leakage noise currents from the unselected transistor storage elements.

\* \* \* \* \*

UNITED STATES PATENT AND TRADEMARK OFFICE
CERTIFICATE OF CORRECTION

Page 1 of 1

PATENT NO. : 12,224,000 B2
APPLICATION NO. : 17/827763
DATED : February 11, 2025
INVENTOR(S) : Azeez Bhavnagarwala It is certified that error appears in the above-identified patent and that said Letters Patent is hereby corrected as shown below:

In the Specification

At Column 6, Line number 25: "{I1P (636). I1N (634)) with dynamic reset (R571 (632/633)," should read -- {I1P (636). I1N (634)) with dynamic reset (RST1 (632/633), --

At Column 8, Line number 54: "14 (1400) with a 4a increase in PG NFET VT only)." should read -- 14 (1400) with a 4σ increase in PG NFET VT only). --

Signed and Sealed this
Twenty-fifth Day of March, 2025

Coke Morgan Stewart
*Acting Director of the United States Patent and Trademark Office*